(12) United States Patent
Hikosaka

(10) Patent No.: US 11,105,968 B2
(45) Date of Patent: Aug. 31, 2021

(54) OPTICAL CONNECTOR DEVICE

(71) Applicant: Yazaki Corporation, Tokyo (JP)

(72) Inventor: Tomohiro Hikosaka, Makinohara (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 16/824,993

(22) Filed: Mar. 20, 2020

(65) Prior Publication Data
US 2020/0218003 A1 Jul. 9, 2020

Related U.S. Application Data

(63) Continuation of application No. PCT/JP2018/028703, filed on Jul. 31, 2018.

(30) Foreign Application Priority Data

Sep. 21, 2017 (JP) .............................. JP2017-181295
Nov. 1, 2017 (JP) .............................. JP2017-211473

(51) Int. Cl.
*G02B 6/36* (2006.01)
*F21V 8/00* (2006.01)
*G02B 6/38* (2006.01)

(52) U.S. Cl.
CPC ......... *G02B 6/0021* (2013.01); *G02B 6/3834* (2013.01); *G02B 6/3869* (2013.01); *G02B 6/3885* (2013.01)

(58) Field of Classification Search
CPC .. G02B 6/0021; G02B 6/3834; G02B 6/3869; G02B 6/3885; G02B 6/3895; G02B 6/3893; G02B 6/36
See application file for complete search history.

(56) References Cited

U.S. PATENT DOCUMENTS

| | | | |
|---|---|---|---|
| 4,636,034 A | 1/1987 | Kashimura et al. | |
| 5,179,607 A | 11/1993 | Sellers et al. | |
| 5,621,834 A | 4/1997 | Anderson et al. | |
| 6,179,478 B1 | 1/2001 | Shouji et al. | |
| 6,341,898 B1 * | 1/2002 | Matsushita | G02B 6/4292 385/139 |
| 8,602,661 B2 * | 12/2013 | Matsuo | B29C 45/1671 385/93 |
| 8,737,784 B2 * | 5/2014 | Kawai | G02B 6/4292 385/47 |
| 2010/0278488 A1 * | 11/2010 | Miyazaki | G02B 6/3897 385/54 |

(Continued)

FOREIGN PATENT DOCUMENTS

| | | |
|---|---|---|
| JP | 58-93017 A | 6/1983 |
| JP | 6-51163 A | 2/1994 |

(Continued)

*Primary Examiner* — Jennifer Doan
(74) *Attorney, Agent, or Firm* — Sughrue Mion, PLLC

(57) ABSTRACT

An optical connector device includes a first optical connector that has a first housing that holds a ferrule; and a second optical connector that has a second housing that houses an FOT and a light guide member. The second housing includes a ferrule insertion portion. The ferrule insertion portion has a ferrule insertion hole into which the ferrule can be inserted. An inner peripheral surface of the ferrule insertion hole has a ferrule fixing structure that fixes the ferrule inside the ferrule insertion hole to suppress play of the ferrule inside the ferrule insertion hole.

2 Claims, 10 Drawing Sheets

(56) References Cited

U.S. PATENT DOCUMENTS

| | | |
|---|---|---|
| 2011/0293223 A1 | 12/2011 | Shimazu et al. |
| 2015/0286013 A1 | 10/2015 | Matsumura |
| 2016/0062047 A1 | 3/2016 | Shimazu et al. |
| 2016/0062048 A1 | 3/2016 | Tanaka et al. |
| 2016/0062049 A1 | 3/2016 | Hashiguchi |
| 2016/0062067 A1 | 3/2016 | Shimazu et al. |
| 2016/0070073 A1 | 3/2016 | Shimazu et al. |

FOREIGN PATENT DOCUMENTS

| | | |
|---|---|---|
| JP | 10-31134 A | 2/1998 |
| JP | 10-246837 A | 9/1998 |
| JP | 2007-11064 A | 1/2007 |
| JP | 2011-95345 A | 5/2011 |
| JP | 2014-126655 A | 7/2014 |
| JP | 5705790 B2 | 4/2015 |

* cited by examiner

OPTICAL CONNECTOR DEVICE

CROSS REFERENCE TO RELATED APPLICATIONS

This application is a continuation of International Patent Application No. PCT/JP2018/028703 filed on Jul. 31, 2018, claiming priority to Japanese Patent Application No. 2017-181295 filed on Sep. 21, 2017 and Japanese Patent Application No. 2017-211473 filed on Nov. 1, 2017, the contents of which are incorporated herein by reference.

FIELD OF INVENTION

The present invention relates to an optical connector device used in an optical communication field, and more specifically, to an optical connector device in which a light guide member is arranged between a fiber optic transceiver (FOT) and a mating side thereof.

BACKGROUND ART

Conventionally, for example, an optical connector device is used for optical communication between in-vehicle devices. As the optical connector device, a technique disclosed in JP2014-126655A has been used.

An optical connector device 1 shown in FIGS. 1 and 2 of JP2014-126655A includes a plug connector 1A and an in-line connector 1B that is mated with the plug connector 1A. The plug connector 1A includes a plug-side housing 20 that holds a plug-side ferrule 12 provided at a distal end of a plug-side optical fiber 11. The in-line connector 1B includes an inline-side housing 40 that holds an inline-side ferrule 32 provided at a distal end of an inline-side optical fiber 31.

The inline-side housing 40 includes an inline-side main body 41. The inline-side main body 41 is provided with a fitting hood portion 41A into which the plug-side housing 20 is fitted, and an accommodating chamber 41B in which the plug-side ferrule 12 is accommodated.

In the optical connector device 1, by fitting the plug-side housing 20 and the inline-side housing 40 the plug-side ferrule 12 is accommodated in the accommodating chamber 41B of the inline-side main body 41, and distal ends of the plug-side ferrule 12 and the inline-side ferrule 32 are in contact with each other. In the optical connector device 1, the plug-side optical fiber 11 and the inline-side optical fiber 31 are optically connected by bringing, the distal ends of the plug-side ferrule 12 and the inline-side ferrule 32 into contact with each other.

However, in the related art, a mating connector (corresponding to the in-line connector 1B in JP2014-126655A) that is mated with the plug connector is not provided with a structure that suppresses play of the plug-side ferrule accommodated in the accommodating chamber (corresponding to the accommodating chamber 41B in JP2014-126655A) inside the mating connector. The related art has the following problems.

In other words, in the related art, since the structure that suppresses the play of the plug-side ferrule is not provided, the play of the plug-side ferrule may be caused in the accommodating chamber of the mating connector, and the plug-side ferrule may be inclined in the accommodating chamber of the mating connector. Due to the inclination of the plug-side ferrule, an optical axis of the plug-side optical fiber may be inclined with respect to an optical axis of a light guide member (corresponding to the inline-side optical fiber 31 in JP2014-126655A) of the mating connector. Such the inclination of the optical axis of the plug-side optical fiber, deviation of the optical axis may occur between the plug-side optical fiber and the light guide member of the mating connector. When the deviation of the optical axis occurs as described above, there is a problem that an optical loss on connector fitting may increase.

SUMMARY

Illustrative aspects of the present invention provide an optical connector device that decreases optical loss on connector fitting by suppressing play of a ferrule in a connector fitting state.

(1) According to an illustrative aspect of the present invention, an optical connector device includes: a first optical connector including a first housing configured to hold a ferrule provided at a distal end of an optical fiber; and a second optical connector including a light guide member for a fiber optic transceiver, and a second housing configured to accommodate the fiber optic transceiver and the light guide member and to which the first housing is fitted. The second housing includes a ferrule insertion portion inside the second housing. The ferrule insertion portion includes a ferrule insertion hole, into which the ferrule is insertable, along an insertion direction of the ferrule, and the ferrule insertion hole is configured to arrange the ferrule so as to be opposed to the light guide member when the ferrule is inserted into the ferrule insertion hole. The ferrule has a cylindrical outer peripheral surface, the ferrule insertion hole has a cylindrical inner peripheral surface. At least one of the cylindrical outer peripheral surface of the ferrule and the cylindrical inner peripheral surface of the ferrule insertion hole is provided with a ferrule fixing structure configured to fix the ferrule in the ferrule insertion hole and to suppress play of the ferrule in the ferrule insertion hole. The ferrule fixing structures is provided in a pair, the pair is arranged symmetrically with respect to a line orthogonal to a center axis of the ferrule insertion hole, arranged on one side of the center axis in a direction orthogonal to the center axis and the line, and arranged to press the ferrule directly onto the cylindrical inner peripheral surface of the ferrule insertion hole on another side of the center axis.

(2) A center axis of the ferrule and the center axis of the ferrule insertion hole may be configured to be parallel to and misaligned with each other

EMBODIMENTS OF INVENTION

Hereinafter, an optical connector device according to a first embodiment of the present invention will be described with reference to FIGS. 1 to 6, an optical connector device according to a second embodiment of the present invention will be described with reference to FIG. 7, an optical connector device according to a third embodiment of the present invention will be described with reference to FIGS. 8 and 9, and an optical connector device according to a fourth embodiment of the present invention will be described with reference to FIG. 10.

First Embodiment

Figure 1:
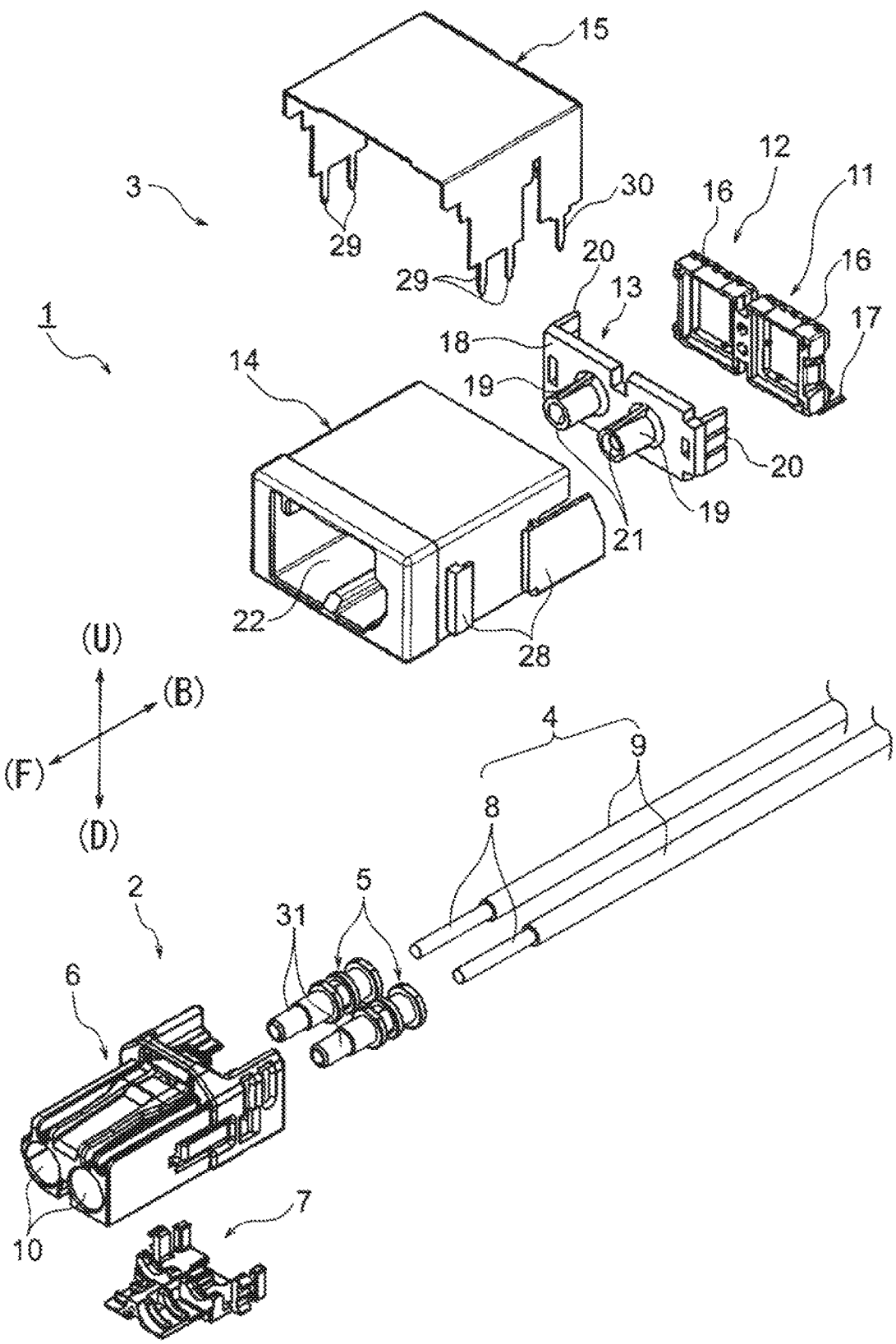
FIG. 1 is an exploded perspective view showing an optical connector device according to a first embodiment of the present invention.
Figure 2:
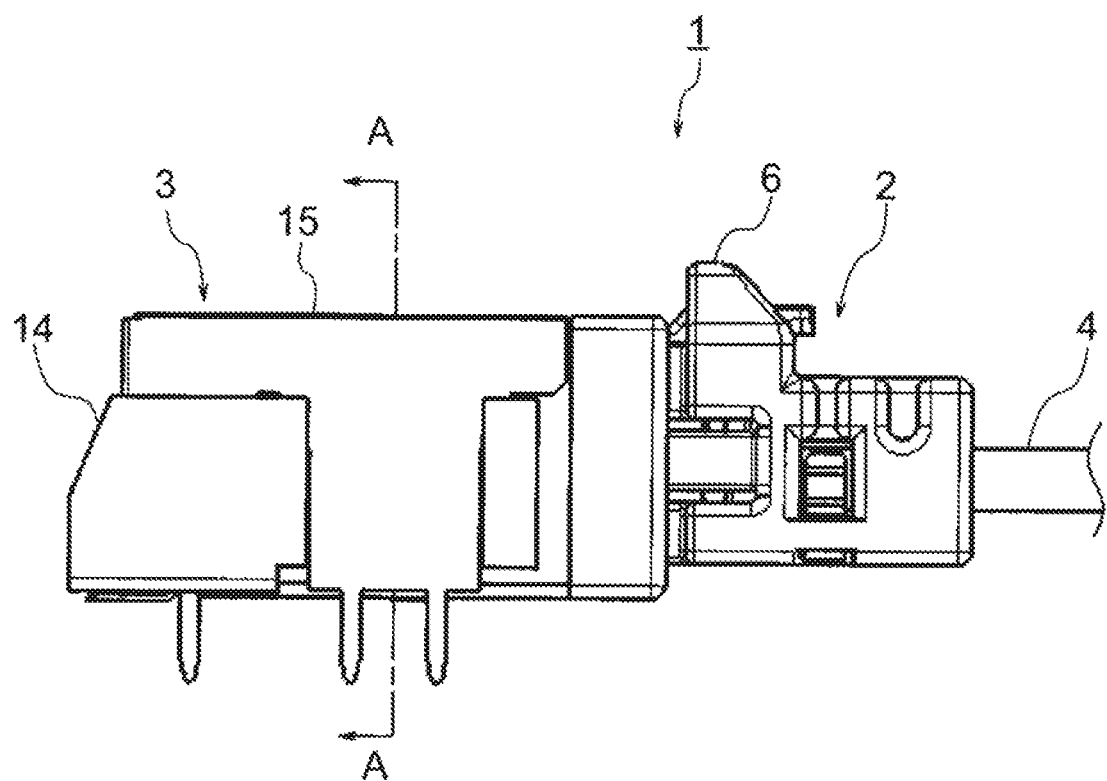
FIG. 2 is a side view showing the optical connector device in a state in which a first optical connector and a second optical connector fit with each other.
Figure 3:
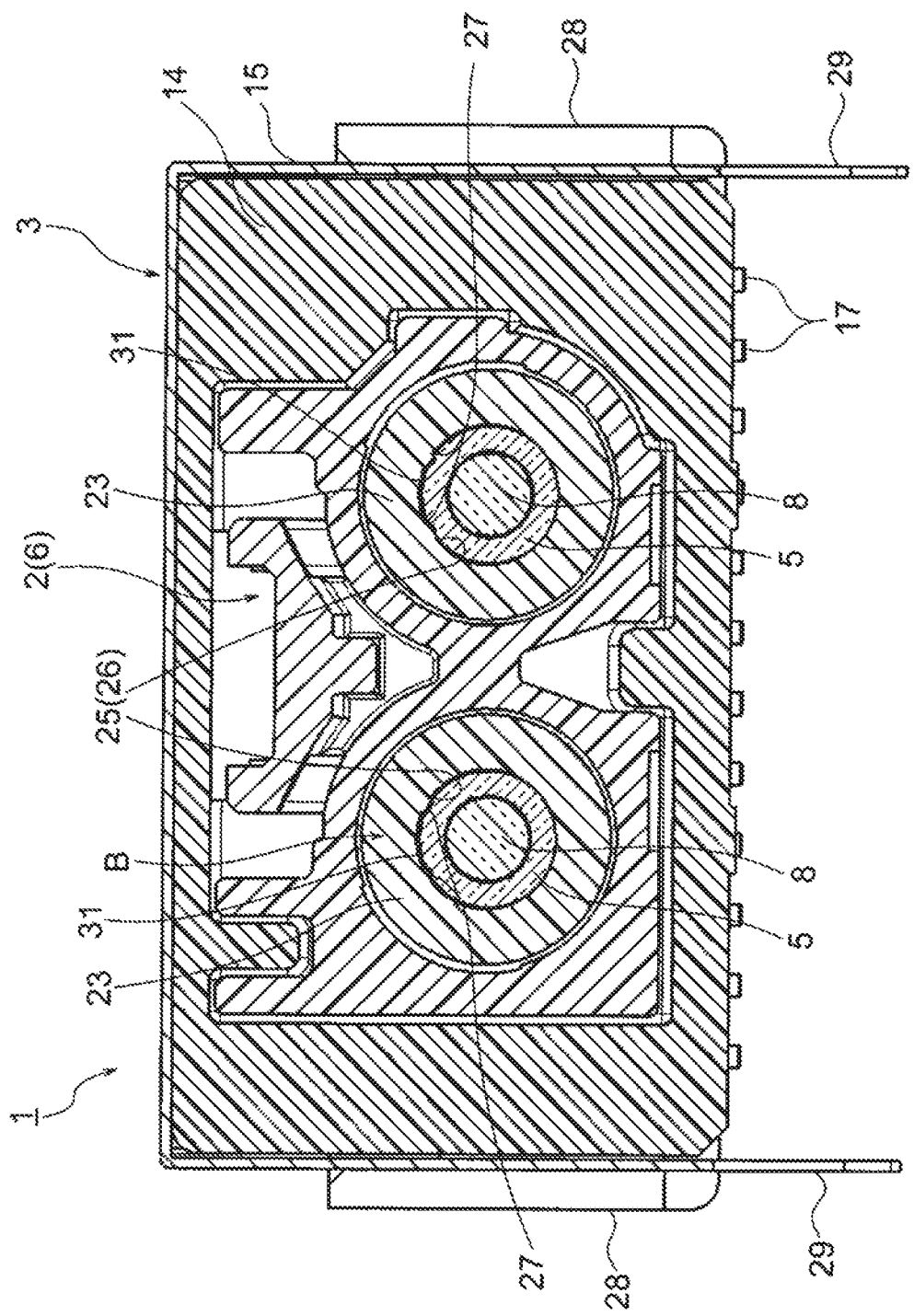
FIG. 3 is a sectional view taken along line A-A in FIG. 2.
Figure 4:
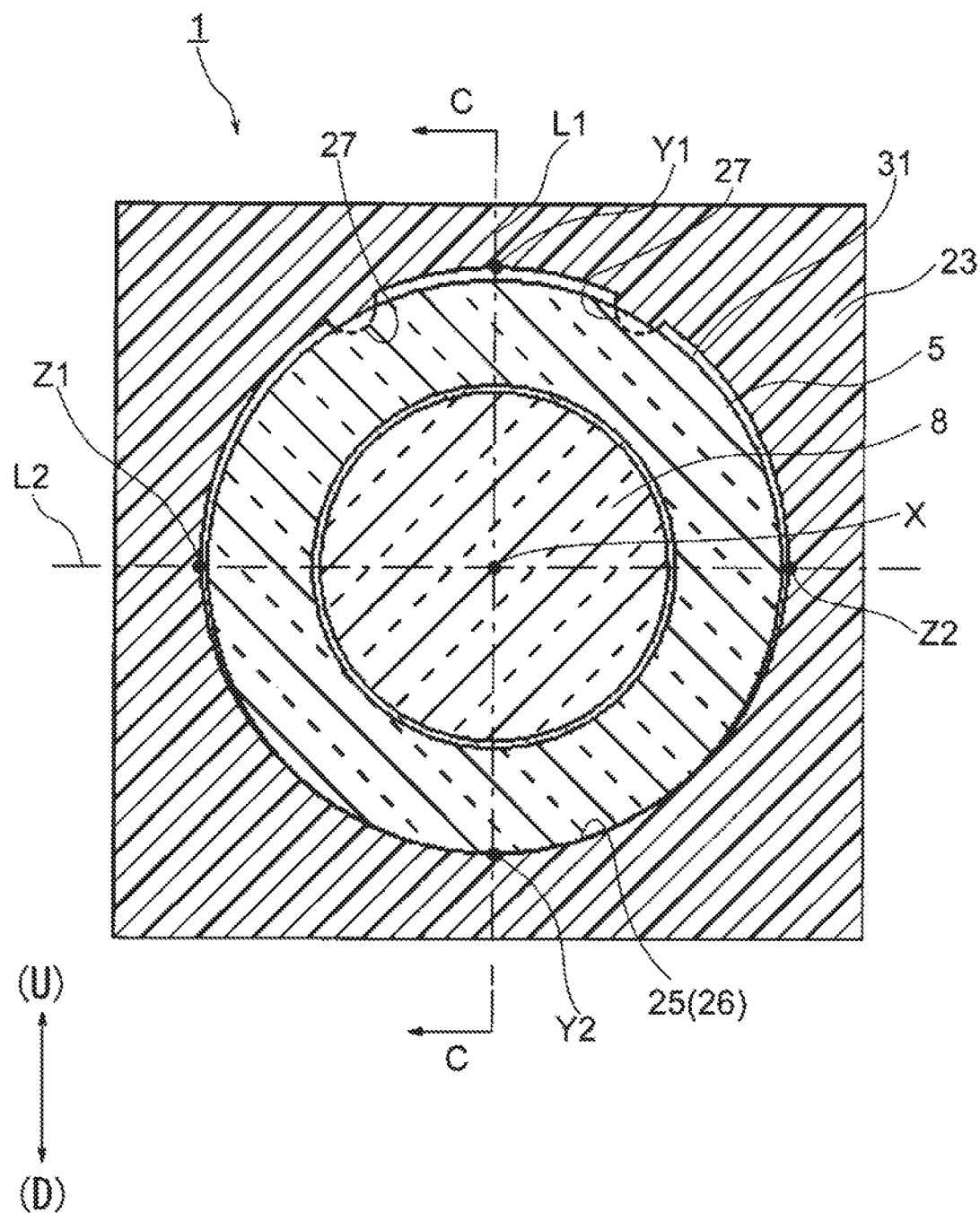
FIG. 4 is an enlarged view of a portion indicated by arrow B in FIG. 3.
Figure 5:
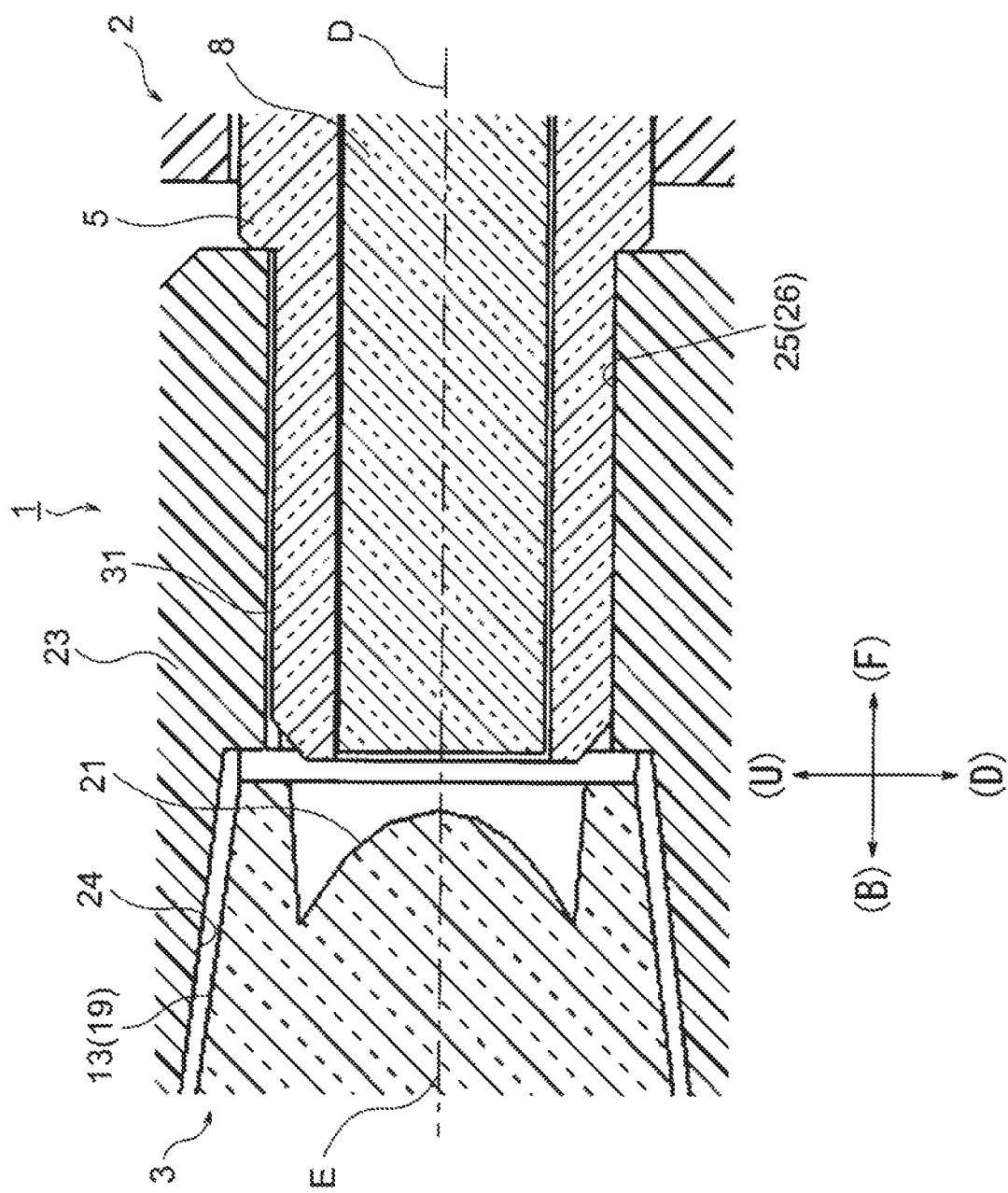
FIG. 5 is a sectional view taken along line C-C in FIG. 4.
Figure 6:
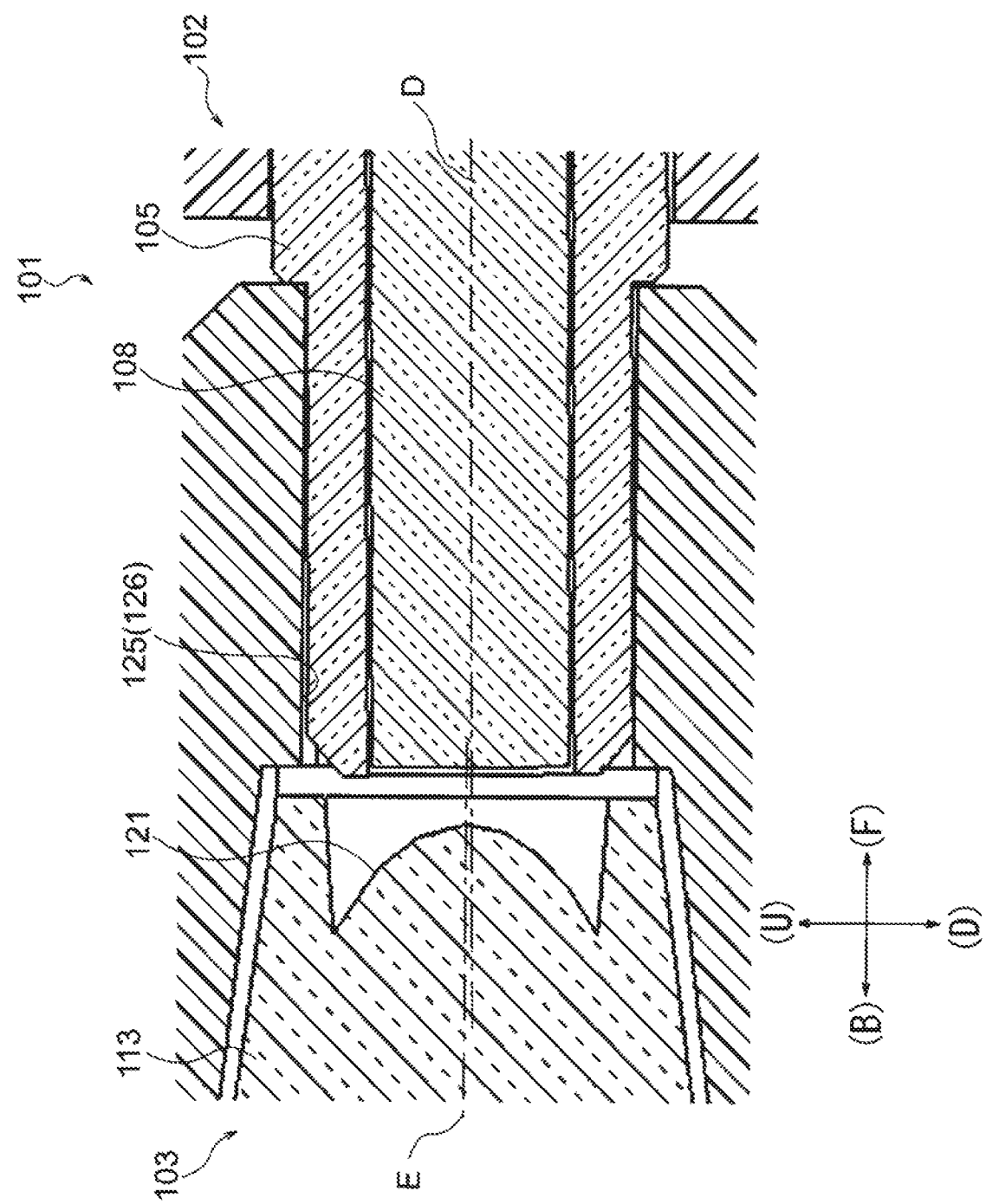
FIG. 6 is a view showing a comparative example.

FIG. 1 is an exploded perspective view showing an optical connector device according to a first embodiment of the present invention, FIG. 2 is a side view showing the optical connector device in a state in which a first optical connector and a second optical connector fit with each other, FIG. 3 is a sectional view taken along line A-A in FIG. 2, FIG. 4 is an enlarged view of a portion indicated by arrow B in FIG. 3, FIG. 5 is a sectional view taken along line C-C in FIG. 4, and FIG. 6 is a view showing a comparative example.

Note that arrows (U) and (D) in the drawing indicate an upper-lower direction, and arrows (F) and (B) indicate a front-rear direction teach of the directions of the arrows is an example).

In FIG. 1, an optical connector device 1 showing the first embodiment of the optical connector device according to the present invention is not particularly limited, but is used for optical communication between in-vehicle devices, for example.

The optical connector device 1 shown in FIG. 1 includes a first optical connector 2 and a second optical connector 3. As shown in FIG. 2, the optical connector device 1 is configured by fitting the first optical connector 2 and the second optical connector 3, and the first optical connector 2 and the second optical connector 3 are optically connected by the fitting. Hereinafter, each configuration of the optical connector device 1 will be described.

First, the first optical connector 2 will be described.

The first optical connector 2 shown in FIG. 1 is a so-called plug connector, and includes a pair of optical fiber cables 4, a pair of ferrules 5, a first housing 6, and a fixing member 7. Hereinafter, each element of the first optical connector 2 will be described.

Each of the optical fiber cables 4 shown in FIG. 1 includes an optical fiber 8 made of light guide material and a coating portion 9. The optical fiber 8 is a so-called multimode plastic optical fiber including a core and a clad that have different refractive indexes from each other and are arranged coaxially with each, other. The coating portion 9 includes a double sheath made of insulating synthetic resin coating an outer side of the optical fiber 8. The optical fiber 8 is exposed at a distal end of the optical cable 4 by peeling the coating portion 9.

Each of the ferrules 5 shown in FIG. 1 has an outer peripheral surface 31 having a cylindrical shape, and is provided with a through hole through which the optical fiber 8 exposed at a distal end of the optical fiber cable 4 can be inserted and held.

The first housing 6 shown in FIG. 1 is made of insulating synthetic resin and is a member finable to a second housing 14 to be described later. The first housing 6 includes therein ferrule accommodating portions 10 accommodating the ferrules 5 provided at respective the distal ends of the optical fiber cables 4. The first housing 6 includes a mounting portion, not shown, opened on a lower surface thereof on which the fixing member 7 is assembled.

The fixing member 7 shown in FIG. 1, without going into details, is a member provided separately from the first housing 6, and is a fixing member that fixes the ferrule 5 provided at the distal end of the optical fiber cable 4 to the first housing 6 by being attached to the first housing 6 with changing an engagement state from a tentative engagement state to a proper engagement state with respect to the first housing 6.

Next, the second optical connector 3 will be described.

The second optical connector 3 shown in FIG. 1 is a so-called PCB connector attached to a printed circuit board (hereinafter referred to as PCB) such as various electronic devices mounted on an automobile or the like. The second optical connector 3 includes a light emitting side fiber optic transceiver (hereinafter referred to as FOT) 11, a light receiving side FOT 12, a light guide member 13, the second housing 14, and a shield case 15. Hereinafter, each element of the second optical connector 3 will be described.

The light emitting side FOT 11 and the light receiving side FOT 12 shown in FIG. 1 are integrally formed, and each include a FOT main body 16 and a plurality of lead frames 17 extending from the FOT main body 16. A light emitting device (for example, an LED), not shown, is built in the FOT main body 16 of the light emitting side FOT 11. A light receiving device (for example, a PD), not shown, is built in the FOT main both 16 of the light receiving side FOT 12. The lead frame 17 is soldered to a circuit connection portion on a PCB, not shown, and is electrically connected to a predetermined circuit.

The light guide member 13 shown in FIG. 1 is made of transparent synthetic resin having optical transparency, and includes a plate-like portion 18, tubular portions 19, and engagement portions 20. The plate-like portion 18 has a substantially rectangular plate shape, and the pair of tubular portions 19 project from the substantially center of the front surface of the plate-like portion 18. Each of the pair of tubular portions 19 includes lens unit 21 (see FIG. 5) having a convex lens function therein. One lens unit 21 condenses light from the light emitting device of the light emitting side FOT 11 on an optical fiber 8, and the other lens unit 21 condenses light from the optical fiber 8 on the light receiving device of the light receiving side FOT 12. The engagement portions 20 are formed to be continuous with both sides of the plate-like portion 18, and are configured to engage with the light emitting side FOT 11 and the light receiving side FOT 12.

The second housing 14 shown in FIG. 1 is made of insulating synthetic resin, and has a box shape. The second housing 14 includes a connector fitting portion 22, a FOT accommodating portion, not shown, and a partition wall, not shown. The connector fitting portion 22 is disposed on a front side of the inside of the second housing 14 and is configured as a space into which the first optical connector 2 (the first housing 6) can fit. The FOT accommodating portion is disposed on a rear side of the inside of the second housing 14 and is formed as a space that can accommodate the light emitting side FOT 11 and the light receiving side FOT 12.

The partition wall is a partition wall dividing the inside of the second housing 14 into the connector fitting portion 22 and the FOT accommodating portion. The partition wall includes a pair of ferrule insertion portions 23 (see FIGS. 3 to 5). Each of the ferrule insertion portions 23 has a tubular shape and is configured to make the connector fitting portion 22 and the FOT accommodating portion communicate with each other. As shown in FIG. 5, each of the ferrule insertion portions 23 includes a tubular portion insertion hole 24 on a base end side of the inside of the ferrule insertion portion 23, and a ferrule insertion hole 25 on a distal end side of the inside of the ferrule insertion portion 23.

The tubular portion insertion hole 24 shown in FIG. 5 is formed along an insertion direction of the tubular portion 19 so that the tubular portion 19 of the light guide member 13 can be inserted therein. As shown in FIG. 5, the tubular portion insertion hole 24 is formed such that the lens unit 21 can be arranged so as to face the ferrule insertion hole 25 when the tubular portion 19 of the light guide member 13 is inserted.

The ferrule insertion hole 25 shown in FIG. 5 is formed along an insertion direction of the ferrule 5 so that the ferrule 5 can be inserted therein. As shown in FIG. 5, the ferrule insertion hole 25 is formed such that the ferrule 5 can be arranged so as to face the lens unit 21 of the light guide member 13 in a state in which the first optical connector 2 (the first housing 6) and the second optical connector 3 (the second housing 14) are fitted and the ferrule 5 is inserted into the ferrule insertion hole 25.

As shown in FIG. 5, the ferrule insertion hole 25 is formed such that the ferrule 5 is arranged so that an optical axis D of the optical fiber 8 substantially coincides with an optical axis E of the lens unit 21 of the light guide member 13 in the state in which the ferrule 5 is inserted.

In the ferrule insertion hole 25, if the optical axis D of the optical fiber 8 and the optical axis E of the lens unit 21 of the light guide member 13 are parallel to each other in the state in which the ferrule 5 is inserted, the optical axis D of the optical fiber 8 and the optical axis E of the lens unit 21 may slightly deviate with each other.

As shown in FIGS. 3 and 4, an inner peripheral surface 26 of the ferrule insertion hole 25 has a cylindrical shape. In the first embodiment, as shown in FIGS. 3 and 4, the ferrule insertion hole 25 is provided with a pair of ferrule fixing structures 27 on the inner peripheral surface 26 thereof. The ferrule fixing structure 27 is configured to fix the ferrule 5 in the ferrule insertion hole 25 in order to suppress play of the ferrule 5 in the ferrule insertion hole 25. In the first embodiment, as shown in FIGS. 3 and 4, the ferrule fixing structure 27 is configured to press the outer peripheral surface 31 of the ferrule 5 so that the ferrule 5 is pressed onto the inner peripheral surface 26 on a lower side of the ferrule insertion hole 25 to be fixed. In the first embodiment, the ferrule fixing structure 27 has a rib shape with a circular arc shape in cross section, and extends along the insertion direction of the ferrule 5.

The ferrule fixing structure 27 is not limited to the one formed in the rib shape as described above. In addition, the ferrule fixing structure 27 may be formed, for example, as a protrusion having a circular arc shape in cross section.

In the first embodiment, as shown in FIG. 4, when a line segment orthogonal to a center axis X of the ferrule insertion hole 25 is defined as a first line segment a line segment orthogonal to the first line segment L1 and passing through the central axis X of the ferrule insertion hole 25 is defined as a second line segment L2, two intersections of the first line segment L1 and the inner peripheral surface 26 of the ferrule insertion hole 25 are respectively defined as first intersections Y1, Y2, and two intersections of the second line segment L2 and the inner peripheral surface 26 of the ferrule insertion hole 25 are respectively defined as second intersections Z1, Z2, the pair of ferrule fixing structures 27 are arranged symmetrically with respect to the first line segment L1, and are arranged to press the ferrule 5 onto the inner peripheral surface 26 of the ferrule insertion hole 25.

In the first embodiment, as shown in FIG. 4, in the pair of ferrule fixing structures 27, one ferrule fixing, structure 27 is arranged between one first intersection Y1 and one second intersection Z1, and the other ferrule fixing structure 27 is arranged between the other first intersection 11 and the other second intersection Z2.

In FIG. 4, the central axis X, the first intersections Y1, Y2, and the second intersections Z1, Z2 are shown by dots, but these dots are shown for convenience of explanation and are not actually visible.

The ferrule fixing structure 27 may at least be configured to press the ferrule 5 onto the inner peripheral surface 26 of the ferrule insertion hole 25 to fix the ferrule 5. The ferrule fixing structure 27 may be arranged symmetrically with respect to the first line segment L1, one ferrule fixing structure 27 may be arranged between the other first intersection 12 and the one second intersection Z1, and the other ferrule fixing structure 27 may be arranged between the other first intersection Y2 and the other second intersection Z2.

The second housing 14 shown in FIG. 1 is provided with shield case positioning portions 28 on both side surfaces thereof. The shield case positioning portions 28 are configured to position the shield case 15 mounted to the second housing 14 in the front-rear direction (directions of arrows (F) and (B)) and in the upper-lower direction (directions of arrows (U) and (D)).

The shield case 15 shown in FIG. 1 is made of conductive metal, has a box shape, and has a size capable of covering the second housing 14 in a state in which the light emitting side POT 11 and the light receiving side FOT 12 are accommodated. Pin-shaped fixing portions 29 and ground portions 30 are formed in a lower portion of the shield case 15. The fixing portion 29 is inserted into and fixed to a fixing hole of the PCB. The ground portion 30 is inserted into a through hole of the PCB and soldered to the ground.

Next, a procedure for assembling (fitting of the first optical connector 2 and the second optical connector 3) the optical connector device according to the first embodiment will be described.

First, the first optical connector 2 and the second optical connector 3 are assembled in advance. Thereafter, when the first optical connector 2 is inserted into the connector fitting portion 22 of the second housing 14 of the second optical connector 3 from the front side, as shown in FIG. 2, the first optical connector 2 and the second optical connector 3 are fitted. Therefore, the assembly of the optical connector device (the fitting of the first optical connector 2 and the second optical connector 3) is completed.

Next, a comparison between the optical connector device 1 according to the first embodiment and an optical connector device 101 according to the comparative example will be described.

In the optical connector device 1 according to the first embodiment when the first optical connector 2 (the first housing 6) and the second optical connector 3 (the second housing 14) are fitted as shown in FIG. 2, the ferrule 5 is inserted into the ferrule insertion hole 25, and the ferrule 5 is arranged opposite to the lens unit 21 of the light guide member 13 as shown in FIG. 5.

In the optical connector device 1 according to the first embodiment, in the state in which the first optical connector 2 and the second optical connector 3 are fitted, the outer peripheral surface 31 of the ferrule 5 is pressed by the ferrule fixing, structure 27, so that the ferrule 5 is pressed onto the inner peripheral surface 26 on the lower side of the ferrule insertion hole 25 and is fixed. By fixing the ferrule 5 as described above, the play of the ferrule 5 in the ferrule insertion hole 25 when the first optical connector 2 and the second optical connector 3 are fitted is suppressed. As described above, by suppressing the play of the ferrule 5, inclination of the ferrule 5 in the ferrule insertion hole 25 is restricted, and a center of the ferrule 5 is fixed. As described above, since the center of the ferrule 5 is fixed, the deviation of the optical axis D of the optical fiber 8 with respect to the optical axis E of the lens unit 21 of the light guide member 13 is suppressed.

In the optical connector device 1 according to the first embodiment, the ferrule 5 is always pressed onto the inner peripheral surface 26 of the ferrule insertion hole 25 by the pair of ferrule fixing structures 27. Accordingly, the play of the ferrule 5 in the ferrule insertion hole 25 when the first optical connector 2 and the second optical connector 3 are fitted is more reliably suppressed, and the deviation of the optical axis D of the optical fiber 8 due to the play is more reliably suppressed.

On the other hand, in the comparative example (the optical connector device 101) shown in FIG. 6, the ferrule fixing structure 27 according to the first embodiment is not provided on an inner peripheral surface 126 of a ferrule insertion hole 125. Therefore, in the optical-connector device 101, play of a ferrule 105 occurs in the ferrule insertion hole 125 when a first optical connector 102 and a second optical connector 103 are fitted. As described above, as shown in FIG. 6, due to the occurrence of the play of the ferrule 5, the ferrule 105 is inclined in the ferrule insertion hole 125, and a center of the ferrule 105 is unstable. As described above, in the optical connector device 101 of the comparative example, since the center of the ferrule 105 is unstable, an optical axis D of an optical fiber 108 is deviated with respect to an optical axis E of a lens unit 121 of a light guide member 113.

Next, effects of the optical connector device 1 according to the first embodiment will be described.

As described above with reference to FIGS. 1 to 6, in the optical connector device 1 according to the first embodiment since the play of the ferrule 5 when the first optical connector 2 and, the second optical connector 3 are fitted is suppressed and the inclination of the ferrule 5 in the ferrule insertion hole 25 is restricted, the deviation of the optical axis D of the optical fiber 8 with respect to the optical axis E of the lens unit 21 of the light guide member 13 is suppressed. Since the deviation between the optical axis D of the optical fiber 8 and the optical axis F of the lens unit 21 is suppressed as described above, there is an effect that an optical loss when the first optical connector 2 and the second optical connector 3 are fitted is suppressed.

Second Embodiment

In addition to the first embodiment, the optical connector device according to the present invention may use the following second embodiment. Hereinafter, the second embodiment will be described with reference to FIG. 7, FIG. 7 is a view showing the optical connector device according to the second embodiment of the present invention.

The same components as those in the first embodiment are denoted by the same reference numerals, and a detailed description thereof is omitted.

Figure 7:
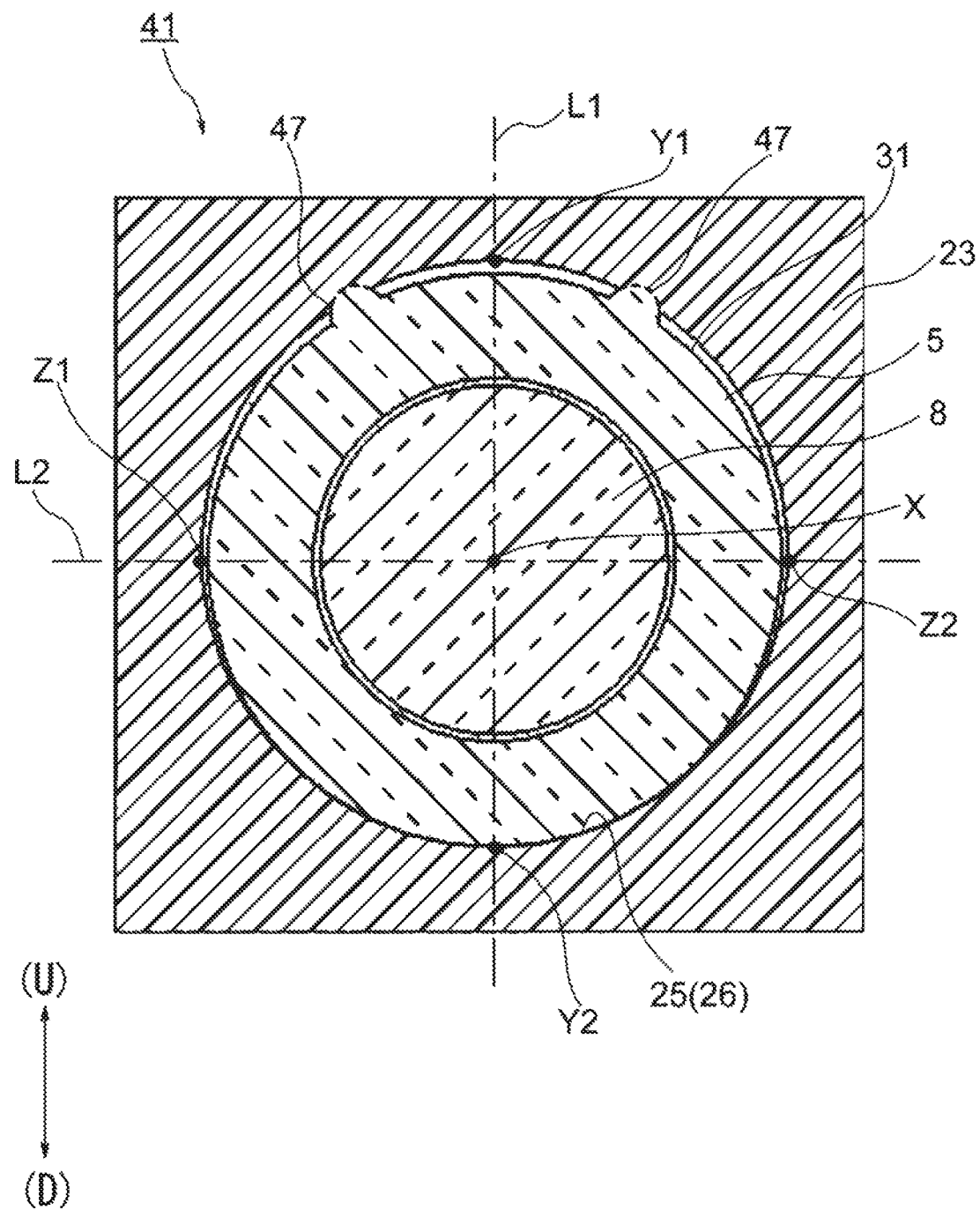
FIG. 7 is a view showing an optical connector device according to a second embodiment of the present invention.

An optical connector device 41 shown in FIG. 7 is different from the first embodiment in that a pair of ferrule fixing structures 47 are provided on the outer peripheral surface 31 of the ferrule 5. As shown in FIG. 7, the ferrule fixing structures 47 are configured to press the inner peripheral surface 26 of the ferrule insertion hole 25 so that the ferrule 5 is pressed onto the inner peripheral surface 26 on the lower side of the ferrule insertion hole 25 and is fixed.

Next, effects of the optical connector device 41 according to the second embodiment will be described.

As described above with reference to FIG. 7, the optical connector device 41 according to the second embodiment has the same effects as those of the first embodiment.

Third Embodiment

In addition to the first and second embodiments, the optical connector device according to the present invention may use the following third embodiment. Hereinafter, a third embodiment will be described with reference to FIGS. 8 and 9.

Figure 8:
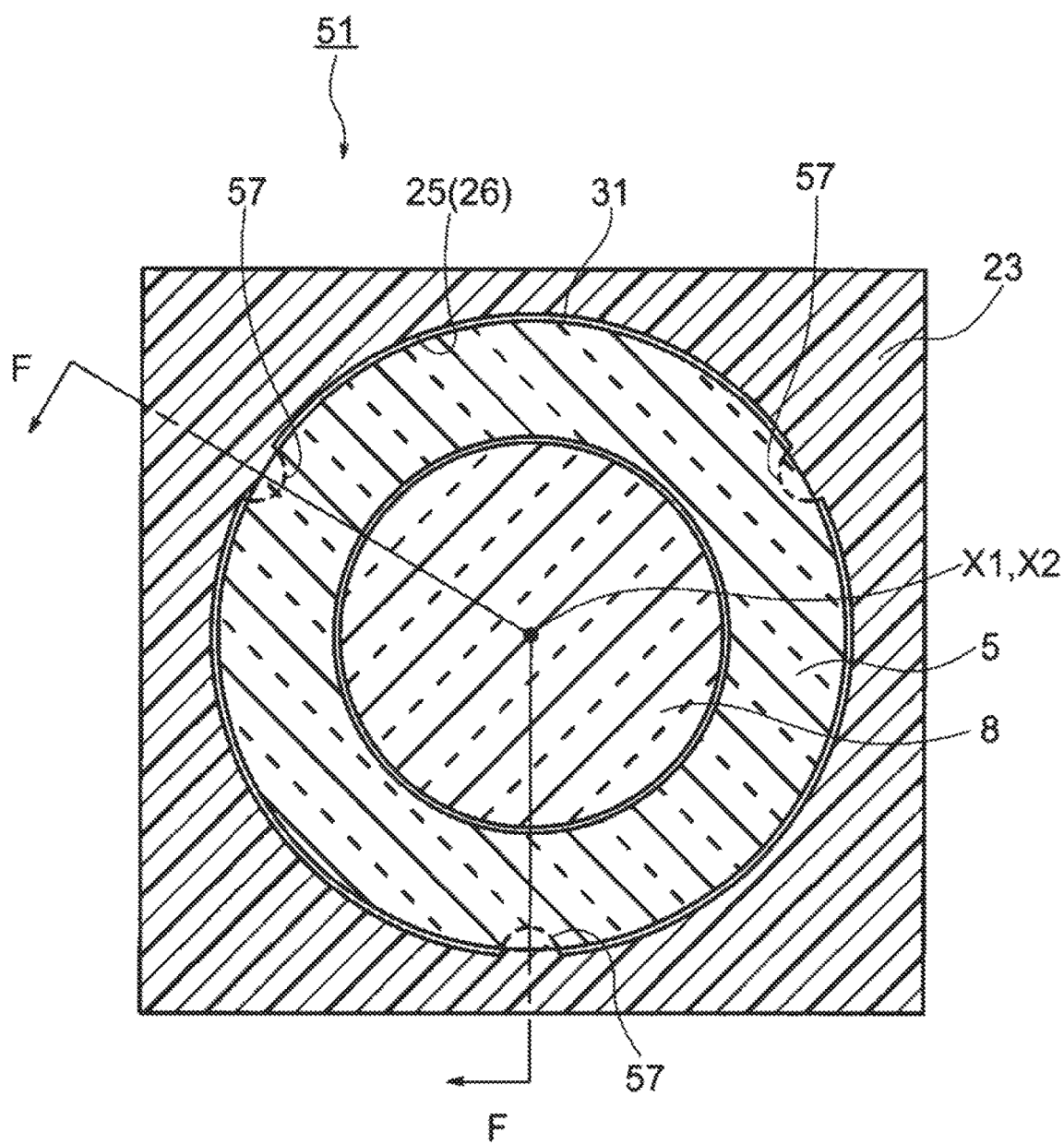
FIG. 8 is a view showing an optical connector device according to a third embodiment of the present invention.
Figure 9:
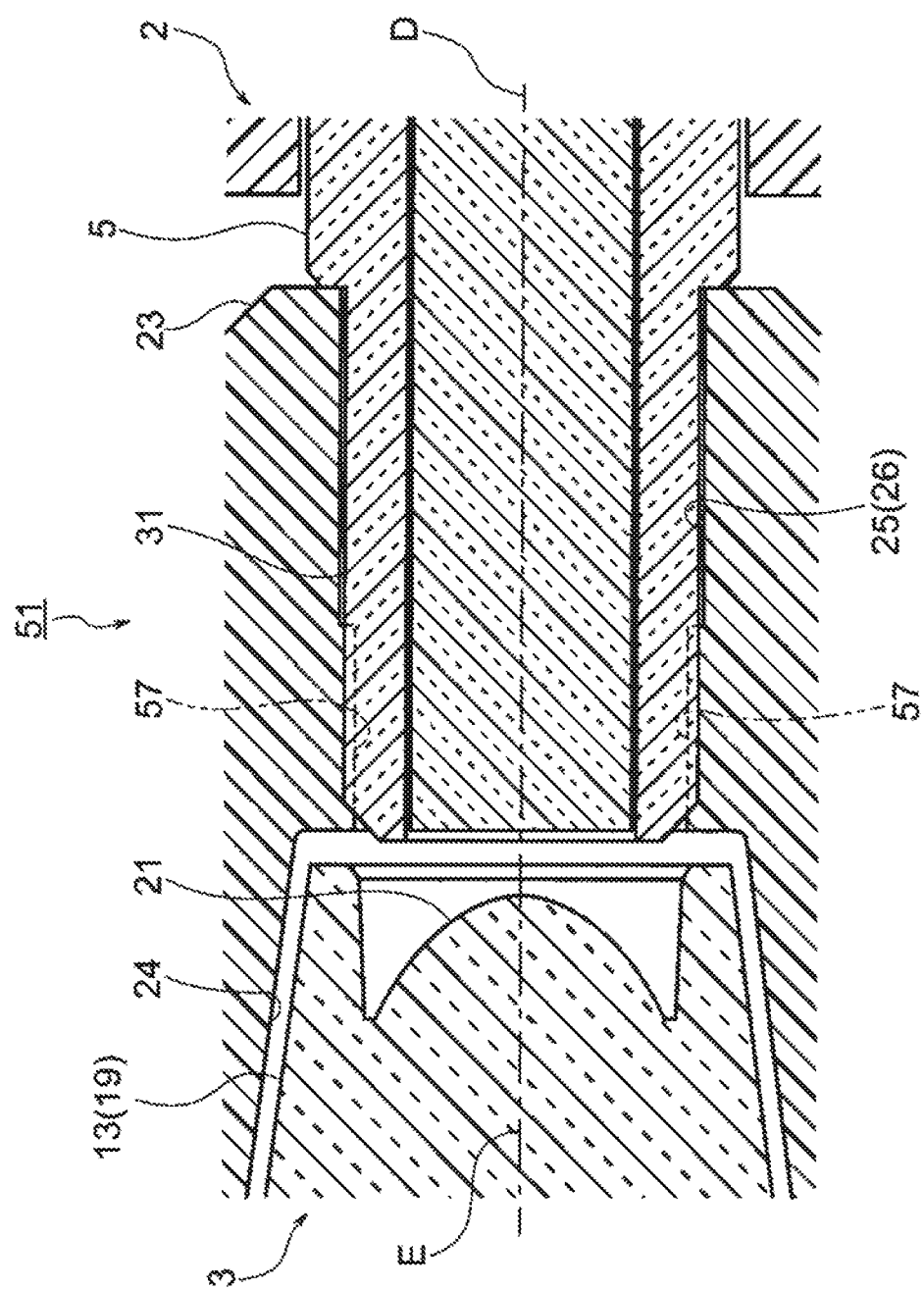
FIG. 9 is a sectional view taken along line F-F in FIG. 8.

FIG. 8 is a view showing the optical connector device according, to the third embodiment of the present invention, and FIG. 9 is a sectional view taken along line F-F in FIG. 8.

The same components as those in the first embodiment are denoted by the same reference numerals, and a detailed description thereof is omitted.

An optical connector device 51 shown in FIG. 8 is similar to the first embodiment in that the "ferrule fixing structure" described in claims is provided on the inner peripheral surface 26 of the ferrule insertion hole 25, but the optical connector device 51 is different from the first embodiment in the number and an arrangement position of the "ferrule fixing structure".

As shown in FIG. 8, ferrule fixing structures 57 according to the third embodiment are configured such that the ferrule 5 is fixed in such a manner in which a center axis X1 of the ferrule 5 and a center axis X2 of the ferrule insertion hole 25 are substantially coincident with each other.

The ferrule fixing structures 57 shown in FIG. 8 are arranged at at least three positions (three positions in the third embodiment) on the inner peripheral surface 26 of the ferrule insertion hole 25, and are arranged at substantially equal intervals (dividing the inner peripheral surface 26 substantially equally into three in the third embodiment) in a peripheral direction of the inner peripheral surface 26 of the ferrule insertion hole 25.

The number and arrangement positions of the ferrule fixing structures 57 are not limited to those described above. The number and the arrangement positions of the ferrule fixing structures 57 may be any as long as the ferrule 5 can be fixed in such a manner in which the center axis X1 of the ferrule 5 and the center axis X2 of the ferrule insertion hole 25 are substantially coincident with each other. For example, the ferrule fixing structures 57 may be arranged at four positions on the inner peripheral surface 26 of the ferrule insertion hole 25, and may be arranged at substantially equal intervals dividing the inner peripheral surface 26 into four in the peripheral direction of the inner peripheral surface 26 of the ferrule insertion hole 25.

Next, a comparison between the optical connector device 51 according to the third embodiment and the optical connector device 101 according to the comparative example will be described.

In the optical connector device 51 according to the third embodiment, when the first optical connector 2 (the first housing 6) and the second optical connector 3 (the second housing 14) are fitted, the ferrule 5 is inserted into the ferrule insertion hole 25, and the ferrule 5 is arranged opposite to the lens unit 21 of the light guide member 13 as shown in FIG. 9.

In the optical connector device 51 according to the third embodiment, as shown in FIG. 8, the ferrule 5 is fixed by the ferrule fixing structures 57 in such a manner in which the center axis X1 of the ferrule 5 and the center axis X2 of the ferrule insertion hole 25 are substantially coincident with each other. By fixing the ferrule 5 as described above, the play of the ferrule 5 in the ferrule insertion hole 25 in a connector fitting state is suppressed. Further, by fixing the ferrule 5 as described above, the arrangement of the ferrule 5 is regulated such that the center axis X1 is substantially coincident with the center axis X2 of the ferrule insertion hole 25. The ferrule 5, whose arrangement is regulated such that the center axis X1 is substantially coincident with the center axis X2 of the ferrule insertion hole 25, stays in a state in which the center axis X1 has no deviation from the center axis X2 of the ferrule insertion hole 25. As described above, since the play of the ferrule 5 is suppressed and the center axis X1 of the ferrule 5 does not deviate from the center axis X2 of the ferrule insertion hole 25, the inclination of the ferrule 5 in the ferrule insertion hole 25 is restricted, and the center of the ferrule 5 is fixed, so that the optical axis D of the optical fiber 8 stabilizes. As described above, since the optical axis D of the optical fiber 8 stabilizes, as shown in FIG. 9, the deviation of the optical axis D of the optical fiber 8 with respect to the optical axis F of the lens unit 21 of the light guide member 13 decreases.

In the optical connector device 51 according to the third embodiment, the ferrule 5 is fixed by the ferrule fixing structures 57 in such a manner in which the center axis X1 of the ferrule 5 and the center axis X2 of the ferrule insertion hole 25 are necessarily substantially coincident with each other. As a result, the play of the ferrule 5 in the ferrule insertion hole 25 in the connector fitting state is more reliably suppressed, and the center axis X1 of the ferrule 5 does not deviate from the center axis X2 of the ferrule insertion hole 25, so that the deviation of the optical axis D of the optical fiber 8 due to the play and the deviation of the central axes X1, X2 more reliably decreases.

On the other hand, in the comparative example (the optical connector device 101) shown in FIG. 6, the ferrule fixing structure 57 according to the third embodiment is not provided on the inner peripheral surface 126 of the ferrule insertion hole 125. Therefore, in the optical connector device 101, the play of the ferrule 105 occurs in the ferrule insertion hole 125 when the first optical connector 102 and the second optical connector 103 are fitted. As described above, as shown in FIG. 6, due to the occurrence of the play of the ferrule 105, the ferrule 105 inclines in the ferrule insertion hole 125, and the center of the ferrule 105 gets unstable. As described above, since the center of the ferrule 105 is unstable, the optical axis D of the optical fiber 108 deviates from the optical axis E of the lens unit 121 of the light guide member 113.

Next, effects of the optical connector device 51 according to the third embodiment be described.

As described above with reference to FIGS. 8 and 9, the optical connector device 51 according to the third embodiment has the following effects in addition to the effects of the first embodiment. That is, in the optical connector device 51 according to the third embodiment, since the center axis X1 of the ferrule 5 does not deviate from the center axis X2 of the ferrule insertion hole 25, the optical axis D of the optical fiber 8 stabilizes, and as shown in FIG. 9, the deviation of the optical axis D of the optical fiber 8 from the optical axis E of the lens unit 21 of the light guide member 13 more reliably decreases. As described above, since the deviation of the optical axis D of the optical fiber 8 from the optical axis E of the lens unit 21 more reliably decreases, center optical axes of the lens unit 21 and the optical fiber 8 are allowed to get closer to each other, so that there is an effect that an optical loss when the first optical connector 2 and the second optical connector 3 are fitted further decreases.

Fourth Embodiment

In addition to the first to third embodiments, the optical connector device according to the present invention may use the following fourth embodiment. Hereinafter, the fourth embodiment will be described with reference to FIG. 10.

Figure 10:
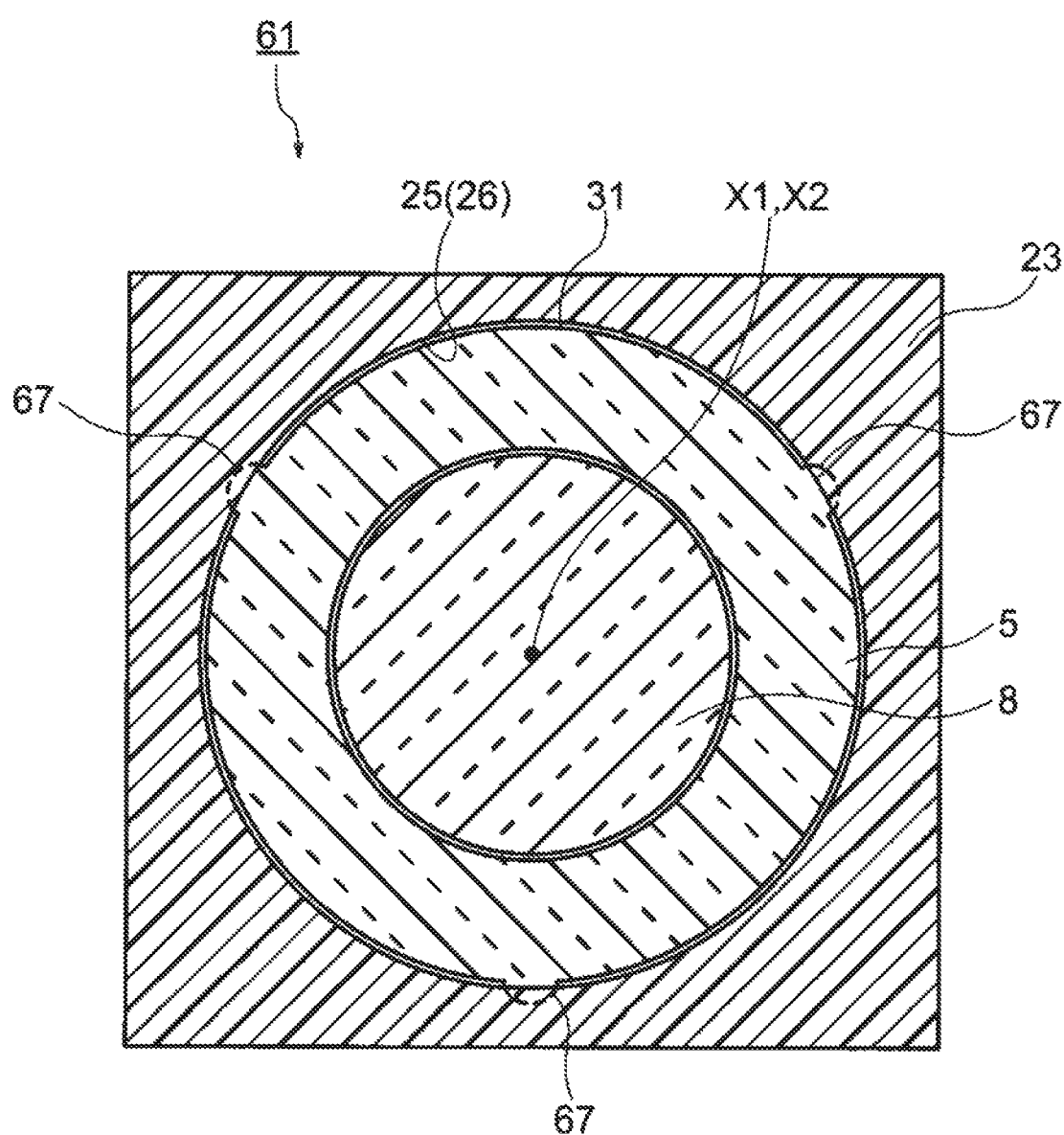
FIG. 10 is a view showing an optical connector device according to a fourth embodiment of the present invention.

FIG. 10 is a view showing an optical connector device according to the fourth embodiment of the present invention.

The same components as those in the first embodiment are denoted by the same reference numerals, and a detailed description thereof is omitted.

An optical connector device 61 shown in FIG. 10 is similar to the second embodiment in that the "ferrule fixing structure" described in claims is provided on the outer peripheral surface 31 of the ferrule 5, but the optical connector device 61 is different from the second embodiment in the number and an arrangement position of the "ferrule fixing structure".

As shown in FIG. 10, ferrule fixing structures 67 according to the fourth embodiment are similar to the ferrule fixing structures 57 in the third embodiment in that the ferrule 5 is fixed in such a manner in which the center axis X1 of the ferrule 5 and the center axis X2 of the ferrule insertion hole 25 are substantially coincident with each other.

The ferrule fixing structures 67 shown in FIG. 10 are arranged at three or more positions (three positions in the fourth embodiment) on the outer peripheral surface 31 of the ferrule 5, and are arranged at substantially equal intervals (dividing the outer peripheral surface 31 substantially equally into three in the fourth embodiment) in a peripheral direction of the outer peripheral surface 31 of the ferrule 5.

The number and arrangement positions of the ferrule fixing structures 67 are not limited to those described above. The number and the arrangement positions of the ferrule fixing structures 67 may be any as long as the ferrule 5 can be fixed in such a manner in which the center axis X1 of the ferrule 5 and the center axis X2 of the ferrule insertion hole 25 are substantially coincident with each other. For example, the ferrule fixing structures 67 may be arranged at four positions on the outer peripheral surface 31 of the ferrule 5, and may be arranged at substantially equal intervals dividing the outer peripheral surface 31 into four in the peripheral direction of the outer peripheral surface 31 of the ferrule 5.

Next, effects of the optical connector device 61 according to the fourth embodiment will be described.

As described above with reference to FIG. 10, the optical connector device 61 according to the fourth embodiment has the same effects as those of the first and third embodiments.

In addition, it goes without saying that the present invention can be variously modified without departing from the spirit of the present invention.

As described above, the first embodiment has a configuration in which the ferrule fixing structure 27 is provided on the inner peripheral surface 26 of the ferrule insertion hole 25, and the second embodiment has a configuration in which the ferrule fixing structure 47 is provided on the outer peripheral surface 31 of the ferrule 5, but the present invention is not limited thereto and may be configured as follows.

That is, although not shown, the ferrule fixing structure may be provided on the inner peripheral surface 26 of the ferrule insertion hole 25 and the outer peripheral surface 31 of the ferrule 5.

As described above, the third embodiment has a configuration in which the ferrule fixing structure 57 is provided on the inner peripheral surface 26 of the ferrule insertion hole 25, the fourth embodiment has a configuration in which the ferrule fixing structure 67 is provided on the outer peripheral surface 31 of the ferrule 5, but the present invention is not limited thereto and may be configured as follows.

That is, although not shown, the ferrule fixing structure 57 in the third embodiment may be provided on the inner peripheral surface 26 of the ferrule insertion hole 25, and the ferrule fixing structure 67 in the fourth embodiment may be provided on the outer peripheral surface 31 of the ferrule 5.

The present invention is not limited to the embodiments described above and may be appropriately modified, improved, or the like. In addition, materials, shapes, dimensions, numbers, arrangement positions or the like of each constituent element in the embodiments described above are optional and not limited as long as the object of the invention can be achieved.

Here, characteristics of the embodiments of the optical connector device according to the present invention described above are briefly summarized and listed in the following [1] to [5], respectively.

[1] An optical connector device (1, 41, 51, 61) including:
  a first optical connector (2) including a first housing (6) configured to hold a ferrule (5) provided at a distal end of an optical fiber (8); and
  a second optical connector (3) including, a light guide member (13) for a FOT (light emitting side FOT 11 and light receiving side FOT 12), and a second housing (14) configured to accommodate the FOT and the light guide member and to which the first housing is fitted,
  the second housing including a ferrule insertion portion (23) inside the second housing,
  the ferrule insertion portion including a ferrule insertion hole (25), into which the ferrule is insertable, along an insertion direction of the ferrule, and the ferrule insertion hole being configured to arrange the ferrule so as to be opposed to the light guide member when the ferrule is inserted into the ferrule insertion hole,
  wherein at least one of an outer peripheral surface (31) of the ferrule and an inner peripheral surface (26) of the ferrule insertion hole is provided with a ferrule fixing, structure (27) configured to fix the ferrule in the ferrule insertion hole and to suppress play of the ferrule in the ferrule insertion hole.

[2] The optical connector device (1, 41, 51, 61) according to the above
  wherein the ferrule fixing structure (27, 47, 57, 67) is configured to press the ferrule (5) onto the inner peripheral surface (26) of the ferrule insertion hole (25) to fix the ferrule (5).

[3] The optical connector device (1, 41) according to the above [2],
  wherein the inner peripheral surface (26) of the ferrule insertion hole (25) has a cylindrical shape, and
  the ferrule fixing structure (27, 47) is provided in a pair, the pair being arranged symmetrically with respect to a line (first line L1) orthogonal to a center axis (X) of the ferrule insertion hole and arranged to press the ferrule (5) onto the inner peripheral surface of the ferrule insertion hole.

[4] The optical connector device (51) according to the above [1],
  wherein the ferrule fixing structure (57) is configured to fix the ferrule such that a center axis (X1) of the ferrule (5) and a center axis (X2) of the ferrule insertion hole (25) are substantially coincident with each other.

[5] The optical connector device (61) according to the above [4],
  wherein each of the outer peripheral surface (31) of the ferrule (5) and the inner peripheral surface (26) of the ferrule insertion hole (25) has a cylindrical shape, and
  the ferrule fixing structures (67) are arranged at least three positions and are arranged at substantially equal intervals in a circumferential direction of at least one of the outer peripheral surface of the ferrule or the inner peripheral surface of the ferrule insertion hole.

According to the optical connector device having the above configuration [1], the ferrule is fixed in the ferrule insertion hole by the ferrule fixing structure. Fixing the ferrule as described above suppresses the play of the ferrule in the ferrule insertion hole in a connector fitting state. Suppressing the play of the ferrule in this was restricts inclination of the ferrule in the ferrule insertion hole, and fixes a center of the ferrule. Fixing the center of the ferrule in this way suppresses the deviation of the optical axis of the optical fiber with respect to the optical axis of the light guide member.

According to the optical connector device having the above configuration [2], the ferrule is pressed onto the inner peripheral surface of the ferrule insertion hole and fixed by the ferrule fixing structure. Fixing the ferrule as described above suppresses the play of the ferrule in the ferrule insertion hole in the connector fitting state. Suppressing the play of the ferrule in this gray restricts the inclination of the ferrule in the ferrule insertion hole, and fixes the center of the ferrule. Fixing the center of the ferrule in this way suppresses the deviation of the optical axis of the optical fiber with respect to the optical axis of the light guide member.

According to the optical connector device having the above configuration [3], the ferrule is always pressed onto the inner peripheral surface of the ferrule insertion hole by the ferrule fixing structure. This more reliably suppresses the play of the ferrule in the ferrule insertion hole in the connector fitting state and the deviation of the optical axis of the optical fiber due to the play.

According to the optical connector device having the above configuration [4], the ferrule is fixed by the ferrule fixing structure with the center axis of the ferrule and the center axis of the ferrule insertion hole are substantially coincident with each other. Fixing the ferrule as described above suppresses the play of the ferrule in the ferrule insertion hole in the connector fitting state. Further, fixing the ferrule as described above regulates the arrangement of the ferrule such that the center axis of the ferrule is substantially coincident with the center axis of the ferrule insertion hole. The ferrule, whose arrangement is regulated such that the center axis of the ferrule is substantially coincident with the center axis of the ferrule insertion hole, stay in a state in which the center axis of the ferrule has no deviation from the center axis of the ferrule insertion hole. Suppressing the play of the ferrule and keeping the ferrule in the state in which the center axis of the ferrule has no deviation from the center axis of the ferrule insertion hole restricts the inclination of the ferrule in the ferrule insertion hole and fixes the center of the ferrule, so that the optical axis of the optical fiber stabilizes. Stabilization of the optical axis of the optical fiber suppresses the deviation of the optical axis of the optical fiber with respect to the optical axis of the lens unit is suppressed.

According to the optical connector device having the above configuration [5], the ferrule is fixed by the ferrule fixing structure in such a manner that the center axis of the ferrule and the center axis of the ferrule insertion hole are necessarily substantially coincident with each other. This more reliably suppresses the play of the ferrule in the ferrule insertion hole in the connector fitting state, and keeps the ferrule in the state in which the center axis of the ferrule has no deviation from the center axis of the ferrule insertion hole, so that the deviation of the optical axis of the optical fiber due to the play and the deviation of the center axes more reliably decreases.

What is claimed is:

1. An optical connector device, comprising:
a first optical connector including a first housing configured to hold a ferrule provided at a distal end of an optical fiber; and
a second optical connector including a light guide member for a fiber optic transceiver, and a second housing configured to accommodate the fiber optic transceiver and the light guide member and to which the first housing is fitted,
the second housing including a ferrule insertion portion inside the second housing,
the ferrule insertion portion including a ferrule insertion hole, into which the ferrule is insertable, along an insertion direction of the ferrule, and the ferrule insertion hole being configured to arrange the ferrule so as to be opposed to the light guide member when the ferrule is inserted into the ferrule insertion hole,
wherein the ferrule has a cylindrical outer peripheral surface,
the ferrule insertion hole has a cylindrical inner peripheral surface,
at least one of the cylindrical outer peripheral surface of the ferrule and the cylindrical inner peripheral surface of the ferrule insertion hole is provided with a ferrule fixing structure configured to fix the ferrule in the ferrule insertion hole and to suppress movement of the ferrule in the ferrule insertion hole, and
the ferrule fixing structure is provided as a pair, the pair being arranged symmetrically with respect to a line orthogonal to a center axis of the ferrule insertion hole, arranged on one side of the center axis in a direction orthogonal to the center axis and the line, and arranged to press the ferrule directly onto the cylindrical inner peripheral surface of the ferrule insertion hole on another side of the center axis.

2. The optical connector device according to claim 1, wherein a center axis of the ferrule and the center axis of the ferrule insertion hole are configured to be parallel to and misaligned with each other.

\* \* \* \* \*